(12) United States Patent
Wang et al.

(10) Patent No.: US 11,302,760 B2
(45) Date of Patent: Apr. 12, 2022

(54) ARRAY SUBSTRATE AND FABRICATION METHOD THEREOF, AND DISPLAY DEVICE

(71) Applicant: BOE Technology Group Co., Ltd., Beijing (CN)

(72) Inventors: Ling Wang, Beijing (CN); Yi-Cheng Lin, Beijing (CN); Guang Yan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/652,595

(22) PCT Filed: Apr. 19, 2019

(86) PCT No.: PCT/CN2019/083518
§ 371 (c)(1),
(2) Date: Mar. 31, 2020

(87) PCT Pub. No.: WO2020/211087
PCT Pub. Date: Oct. 22, 2020

(65) Prior Publication Data
US 2021/0233984 A1 Jul. 29, 2021

(51) Int. Cl.
*H01L 27/32* (2006.01)
(52) U.S. Cl.
CPC ...... *H01L 27/3262* (2013.01); *H01L 27/3218* (2013.01); *H01L 27/3227* (2013.01); *H01L 27/3265* (2013.01); *H01L 2227/323* (2013.01)
(58) Field of Classification Search
CPC ............. H01L 27/3262; H01L 27/3218; H01L 27/3227; H01L 27/3265; H01L 2227/323
(Continued)

(56) References Cited

U.S. PATENT DOCUMENTS 6,542,138 B1 * 4/2003 Shannon .............. G09G 3/3233
315/169.3
2005/0200578 A1 * 9/2005 Lee ...................... G09G 3/3413
345/82
(Continued)

FOREIGN PATENT DOCUMENTS

CN 106783921 A 5/2017
CN 107464529 A 12/2017
(Continued)

OTHER PUBLICATIONS

English Machine Translation of CN107464529. (Year: 2017).*

*Primary Examiner* — Dzung Tran
(74) *Attorney, Agent, or Firm* — Arent Fox LLP; Michael Fainberg

(57) ABSTRACT

The embodiment of the present disclosure discloses an array substrate, a fabrication method thereof, and a display device. The array substrate includes: a base substrate and a plurality of pixel units on the base substrate, wherein the pixel unit includes a plurality of sub-pixels; and the sub-pixel includes an electroluminescent component, a pixel circuit and a photo detection circuit; the pixel circuit includes a drive transistor for driving the electroluminescent component to emit light, and the drive transistor is a low temperature poly-si thin film transistor; and the photo detection circuit includes a detection switch transistor and a PIN-type photodiode, and the detection switch transistor is a metal oxide transistor.

15 Claims, 17 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 2007/0046593 A1* | 3/2007 | Shin | ..................... | G09G 3/3233 |
| | | | | 345/81 |
| 2007/0069632 A1* | 3/2007 | Peng | ................... | H01L 27/3269 |
| | | | | 313/501 |
| 2011/0042666 A1* | 2/2011 | Yang | ..................... | H01L 27/124 |
| | | | | 257/43 |
| 2017/0163266 A1* | 6/2017 | Chen | ................... | G09G 3/3233 |
| 2018/0226462 A1 | 8/2018 | Zhou et al. | | |
| 2018/0264622 A1* | 9/2018 | Arthur | ................... | B27G 19/04 |
| 2018/0308869 A1 | 10/2018 | Suzumura et al. | | |
| 2019/0267409 A1* | 8/2019 | Hu | ..................... | H01L 29/7869 |

FOREIGN PATENT DOCUMENTS

| | | |
|---|---|---|
| CN | 108428721 A | 8/2018 |
| CN | 108538255 A | 9/2018 |
| WO | 2016108664 A1 | 7/2016 |

* cited by examiner

ARRAY SUBSTRATE AND FABRICATION METHOD THEREOF, AND DISPLAY DEVICE

The present application is a US National Stage of International Application No. PCT/CN2019/083518, filed Apr. 19, 2019, which is hereby incorporated by reference in its entirety.

FIELD

The present disclosure relates to the technical field of display, and particularly to an array substrate and a fabrication method thereof, and a display device.

BACKGROUND

Organic light emitting diode (OLED) displays are one of the hotspots of the current display research field. Compared to liquid crystal displays (LCD), OLED displays have advantages of low energy consumption, low production cost, self-luminescence, wide angle of view and quick response. OLED displays have been widely applied in the display field such as mobile phones, tablets and digital cameras.

SUMMARY

The embodiment of the present disclosure provides an array substrate. The array substrate includes: a base substrate; and a plurality of pixel units on the base substrate, wherein the pixel unit includes a plurality of sub-pixels; and the sub-pixel includes: an electroluminescent component; a pixel circuit, including a drive transistor for driving the electroluminescent component to emit light, wherein the drive transistor is a low temperature poly-si thin film transistor; and a photo detection circuit, including a detection switch transistor and a PIN-type photodiode, wherein the detection switch transistor is a metal oxide transistor.

Optionally, in the embodiment of the present disclosure, a first electrode of the drive transistor is coupled with a first power terminal, and a second electrode of the drive transistor is coupled with a first terminal of the electroluminescent component; the pixel circuit further includes: a data switch transistor and a compensation switch transistor; a gate of the data switch transistor is coupled with a first scanning signal terminal, a first electrode of the data switch transistor is coupled with a data signal terminal, and a second electrode of the data switch transistor is coupled with a gate of the drive transistor; a gate of the compensation switch transistor is coupled with a second scanning signal terminal, a first electrode of the compensation switch transistor is coupled with a preset signal terminal, and a second electrode of the compensation switch transistor is coupled with a first terminal of the electroluminescent component.

Optionally, in the embodiment of the present disclosure, the data switch transistor is a low temperature poly-si thin film transistor or a metal oxide transistor.

Optionally, in the embodiment of the present disclosure, the compensation switch transistor is a low temperature poly-si thin film transistor or a metal oxide transistor.

Optionally, in the embodiment of the present disclosure, the drive transistor is a N-type transistor; the pixel circuit further includes: a storage capacitor; the storage capacitor is coupled between the gate and the second electrode of the drive transistor.

Optionally, in the embodiment of the present disclosure, the data switch transistor and the compensation switch transistor are both N-type transistors.

Optionally, in the embodiment of the present disclosure, the drive transistor is a P-type transistor; the pixel circuit further includes: a storage capacitor; the storage capacitor is coupled between the gate and the first electrode of the drive transistor.

Optionally, in the embodiment of the present disclosure, the data switch transistor and the compensation switch transistor are both P-type transistors.

Optionally, in the embodiment of the present disclosure, the photo detection circuit further includes: a detection capacitor; a gate of the detection switch transistor is coupled with a third scanning signal terminal, a first electrode of the detection switch transistor is coupled with a second electrode of the PIN-type photodiode, and a second electrode of the detection switch transistor is coupled with an optical detection signal terminal; a first electrode of the PIN-type photodiode is coupled with a reference voltage terminal; the detection capacitor is coupled between the first electrode and the second electrode of the PIN-type photodiode.

Optionally, in the embodiment of the present disclosure, the transistor being the metal oxide transistor is on a side, away from the base substrate, of the transistor being the low temperature poly-si thin film transistor and the PIN-type photodiode.

Correspondingly, the embodiment of the present disclosure also provides a display device including the above array substrate.

Correspondingly, the embodiment of the present disclosure also provides a fabrication method of the array substrate, including: providing a base substrate; forming a pixel circuit and a photo detection circuit on the base substrate; and forming an electroluminescent component on the base substrate with the pixel circuit and the photo detection circuit formed thereon.

Optionally, in the embodiment of the present disclosure, forming the pixel circuit and the photo detection circuit on the base substrate includes: forming a transistor being low temperature poly-si thin film transistor and a PIN-type photodiode on the base substrate; and forming a transistor being metal oxide transistor on the base substrate with the transistor being low temperature poly-si thin film transistor and the PIN-type photodiode formed thereon.

Optionally, in the embodiment of the present disclosure, forming the transistor being low temperature poly-si thin film transistor and the PIN-type photodiode on the base substrate includes: forming a first electrode on the base substrate; forming a polysilicon layer on the base substrate, wherein the polysilicon layer is spaced from the first electrode; forming a first amorphous silicon layer on the first electrodes, wherein the orthographic projection of the first amorphous silicon layer on the base substrate overlaps with the orthographic projection of the first electrode on the base substrate; performing ion doping on the polysilicon layer and the first amorphous silicon layer for the first time; forming a second amorphous silicon layer on the first amorphous silicon layer, wherein the orthographic projection of the second amorphous silicon layer on the base substrate overlaps with the orthographic projection of the first electrode on the base substrate; forming a first gate insulation layer and a first gate sequentially on the polysilicon layer and exposing a source region and a drain region of the polysilicon layer; wherein the orthographic projection of the first gate insulation layer and the first gate on the base substrate covers a channel region of the polysilicon layer; forming a third amorphous silicon layer on the second amorphous silicon layer; wherein the orthographic projection of the third amorphous silicon layer on the base substrate overlaps with the orthographic projection of the first electrode on the base substrate; performing second ion doping on the source region and the drain region of the polysilicon layer and the third amorphous silicon layer for the second time; forming a second electrode on the third amorphous silicon layer, wherein the orthographic projection of the second electrode on the base substrate overlaps with the orthographic projection of the first electrode on the base substrate; and forming a first interlayer dielectric layers on the base substrate with the second electrode formed thereon.

Optionally, in the embodiment of the present disclosure, forming the transistor being metal oxide transistor on the base substrate with the transistor being the low temperature poly-si thin film transistor and the PIN-type photodiode formed thereon includes: forming a metal oxide semiconductor layer, a second gate insulation layer and a second gate sequentially on the first interlayer dielectric layer and exposing a source region and a drain region of the metal oxide semiconductor layer, wherein the orthographic projection of the second gate insulation layer and the second gate on the base substrate covers a channel region of the metal oxide semiconductor layer; forming a second interlayer dielectric layer on the base substrate with the metal oxide semiconductor layer, the second gate insulation layer and the second gate formed thereon; forming first via holes penetrating through the first interlayer dielectric layer and the second interlayer dielectric layer and second via holes penetrating through the second interlayer dielectric layer through etching; and forming a plurality of first connection portions, second connection portions and third connection portions which are spaced on each second interlayer dielectric layer, so that the second electrode is electrically connected with the corresponding first connection portion through the first via hole, the source region and the drain region of the polysilicon layer are respectively electrically connected with the corresponding second connection portions through the first via holes, and the source region and the drain region of the metal oxide semiconductor layer are respectively electrically connected with the corresponding third connection portions through the second via holes, wherein one PIN-type photodiode corresponds to one first connection portion, one low temperature poly-si thin film transistor corresponds to two second connection portions, and one metal oxide transistor corresponds to two third connection portions.

DETAILED DESCRIPTION

Figure 1:
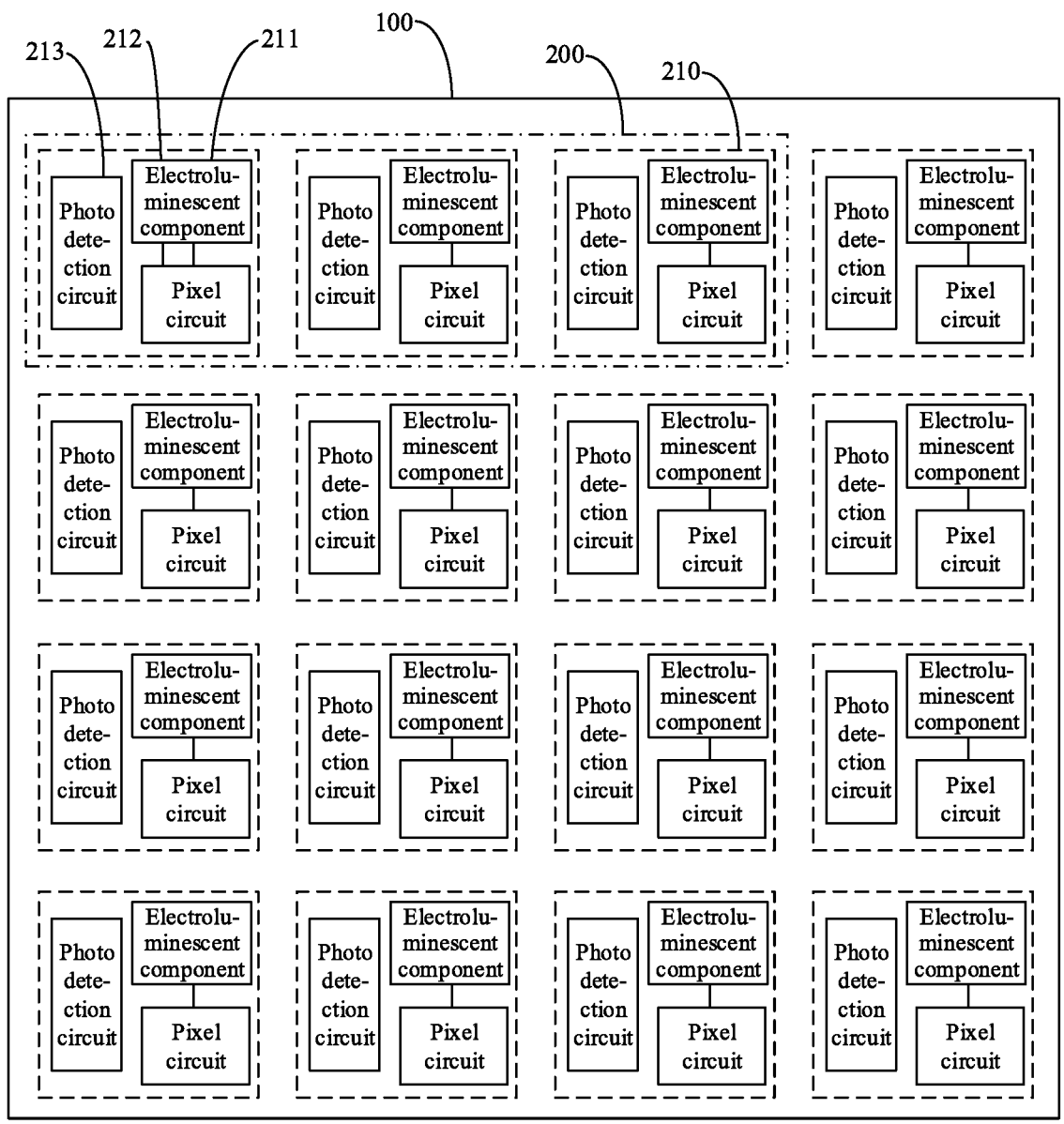
FIG. 1 is a schematic structural diagram of an array substrate according to an embodiment of the present disclosure.

In order to make the objects, the technical solution and the advantages of the present disclosure clearer, the implementations of an array substrate and a fabrication method thereof, and a display device according to the embodiment of the disclosure are described in details below in combination with the attached drawing. It is understood that the preferred embodiments described below only intend to describe and explain the present disclosure, rather than limiting the present disclosure. Without conflicts, the embodiments in the present disclosure and the features in the embodiments can be combined with each other. It is noted that the sizes and the shapes of the elements in the attached drawings do not reflect the real scales, but are only illustrative of the content of the present disclosure. Besides, identical or similar reference numerals represent identical or similar elements or those having identical or similar functions.

Generally, the OLED is driven by the current and controlled by pixel circuit to emit light. In a transistor-based pixel circuit, the drive transistor provides a drive current for the OLED to turn on each sub-pixel. The luminance of the sub-pixel is determined directly by the current magnitude. During operation, the OLED emits light at varying luminance. In order to reduce the adverse effect on the display effect by the varying OLED luminance, a photo detection circuit for detecting the intensity of the light emitted by the OLED is usually arranged in each sub-pixel, so as to compensate for the OLED luminescence. Generally, the photo detection circuit may include a detection switch transistor and a PIN-type photodiode. When the photo detection circuit detects the intensity of the light emitted by the OLED, the PIN-type photodiode receives the light emitted by the OLED and converts the received light into electric signals, so as to compensate for the light-emitting of the OLED through the electric signals. If the detection switch transistor has high leakage current in the off state, the accuracy of the detection result will be adversely affected. The process of fabricating the PIN-type photodiode involves H atoms, and the drive transistor in the pixel circuit is usually a metal oxide transistor; therefore, when the H atoms of the PIN-type photodiode penetrate through the insulation layer and enter the channel region of the active layer of the drive transistor, the threshold voltage of the drive transistor drifts, leading to change of the current flowing through the OLED and thereby non-uniform display luminance, and finally affecting the display effect of the whole image.

Therefore, the embodiment of the disclosure provides an array substrate for improving the display effect.

Figure 2:
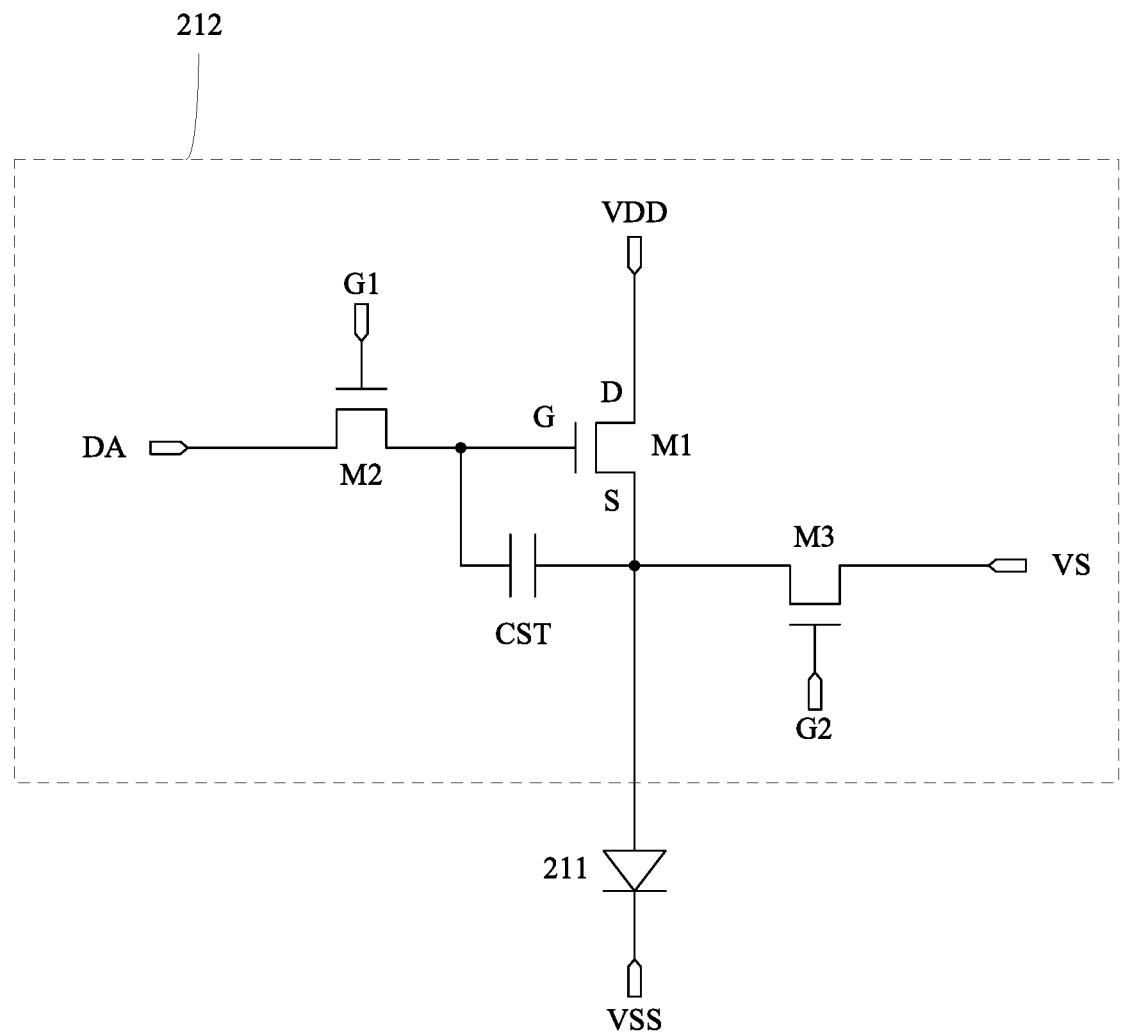
FIG. 2 is a schematic structural diagram of a pixel circuit according to an embodiment of the present disclosure.
Figure 3:
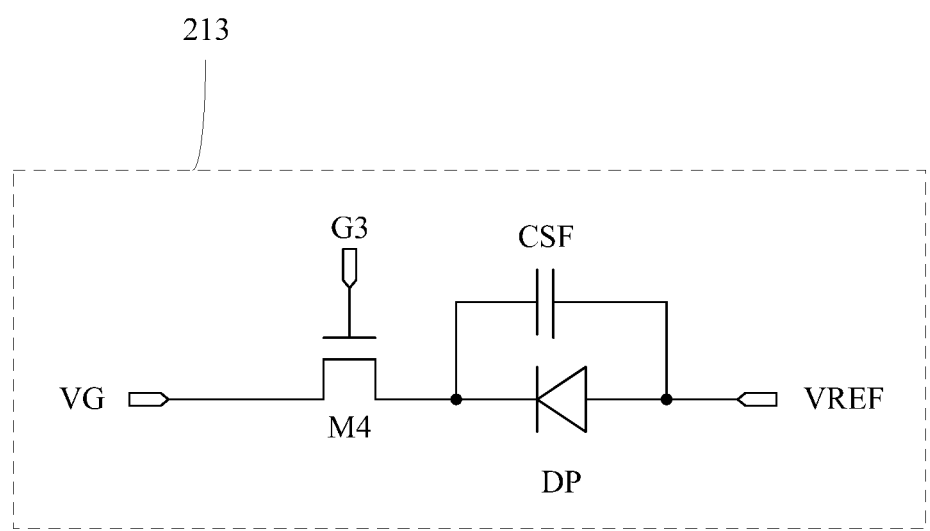
FIG. 3 is a schematic structural diagram of a photo detection circuit according to an embodiment of the present disclosure.

Some of the embodiments provide array substrates. As shown in FIGS. 1-3, the array substrate may include: a base substrate 100; and a plurality of pixel units 200, wherein the plurality of pixel units 200 are located on the base substrate 100, and the pixel unit 200 includes a plurality of sub-pixels 210. The sub-pixel 210 may include: an electroluminescent component 211; a pixel circuit 212, including a drive transistor M1 for driving the electroluminescent component 211 to emit light; wherein the drive transistor M1 is a Low Temperature Poly-Si Thin Film Transistor; and a photo detection circuit 213, including a detection switch transistor M4 and a PIN-type photodiode DP; wherein the detection switch transistor M4 is a metal oxide transistor.

In the array substrate according to the embodiment of the present disclosure, each sub-pixel may include: an electroluminescent component, a pixel circuit and a photo detection circuit. Since a Low Temperature Poly-Si Thin Film Transistor (LTPS TFT) has stable performance under the effect of the H atoms, by using the low temperature poly-si thin film transistor as the drive transistor in the pixel circuit, the influence of the H atoms of the PIN-type photodiode can be avoided, so that the stability of the drive transistor is improved, accordingly the stability of the drive current generated by the drive transistor can be improved, and thus the display effect is further improved. In addition, since a metal oxide transistor has low off leakage current, by using the metal oxide transistor as the detection switch transistor, the influence of the leakage current can be reduced, the accuracy of the detection result can be improved, and thus the display effect can be improved.

The disclosure is described in details below in combination with some embodiments. It should be noted that the embodiment intends to better explain the present disclosure, rather than limiting the present disclosure.

In implementation, in the embodiment of the present disclosure, the pixel unit may include three sub-pixels. Exemplarily, the three sub-pixels may be a red sub-pixel, a green sub-pixel and a blue sub-pixel. Alternatively, the pixel unit may include four sub-pixels. Exemplarily, the four sub-pixels may be a red sub-pixel, a green sub-pixel, a blue sub-pixel and a white sub-pixel. Of course, in the practical application, the number and implementation of the sub-pixels in the pixel units may be designed and determined according to the practical application environment and are not limited herein.

In implementation, in the embodiment of the present disclosure, the first terminal of the electroluminescent component is the positive electrode thereof, and the second terminal of the electroluminescent component is the negative electrode thereof. The second terminal of the electroluminescent component is coupled with a second power terminal VSS. Generally the electroluminescent component has a threshold voltage, and emits light when the voltage difference between the two terminals of the electroluminescent component is larger than or equal to the threshold voltage. Exemplarily, the electroluminescent component may be an OLED. Alternatively, the electroluminescent component may also be a quantum dot light emitting diode (QLED). Of course, in the practical application, the implementation of the electroluminescent component may be designed according to the demand for the practical application environment and is not limited herein.

In implementation, in the embodiment of the present disclosure, as shown in FIG. 2, the first electrode of the drive transistor M1 is coupled with the first power terminal VDD, and the second electrode of the drive transistor M1 is coupled with a first terminal of the electroluminescent component 211.

The pixel circuit 212 may further include: a data switch transistor M2 and a compensation switch transistor M3. A gate of the data switch transistor M2 is coupled with a first scanning signal terminal G1, a first electrode of the data switch transistor M2 is coupled with a data signal terminal DA, and a second electrode of the data switch transistor M2 is coupled with a gate G of the drive transistor M1. A gate of the compensation switch transistor M3 is coupled with a second scanning signal terminal G2, a first electrode of the compensation switch transistor M3 is coupled with a preset signal terminal VS, and a second electrode of the compensation switch transistor M3 is coupled with a first terminal of the electroluminescent component 211.

In implementation, in the embodiment of the present disclosure, when the data switch transistor M2 is turned on under the control of the signal of the first scanning signal terminal G1, the data switch transistor M2 can provide the signal of the data signal terminal DA to the gate G of the drive transistor M1. When the compensation switch transistor M3 is turned on under the control of the signal of the second scanning signal terminal G2, the compensation switch transistor M3 can connect the preset signal terminal VS to the first terminal of the electroluminescent component 211.

In implementation, in the embodiment of the present disclosure, as shown in FIG. 2, the drive transistor M1 may be an N-type transistor. The first electrode of the drive transistor M1 is a drain D, the second electrode of the drive transistor M1 is a source S, and when the drive transistor M1 is saturated, the current flows from the drain D of the drive transistor M1 to the source S of the drive transistor M1, so that the electroluminescent component 211 emits light under the action of the drive current when the drive transistor M1 is saturated.

In implementation, in the embodiment of the disclosure, as shown in FIG. 2, the pixel circuit 212 may further include: a storage capacitor CST; wherein the storage capacitor CST is coupled between the gate G of the drive transistor M1 and the second electrode of the drive transistor M1. That is, the storage capacitor CST is coupled between the gate G of the drive transistor M1 and the source S of the drive transistor M1 so as to store the voltage input to the storage capacitor CST.

In order to reduce the leakage current, in implementation, the data switch transistor M2 may be a metal oxide transistor, which can reduce the influence of the leakage current on the voltage input to the gate G of the drive transistor M1, and improve the stability of the voltage input to the gate G of the drive transistor M1, and further improve the stability of the luminance. Alternatively, in order to unify the process of fabricating the pixel circuit, the data switch transistor M2 may also be a low temperature poly-si thin film transistor. Of course, in the practical application, the implementation of the data switch transistor M2 may be designed and determined according to the practical application environment and is not limited herein.

In order to reduce the leakage current, in implementation, the compensation switch transistor M3 may be a metal oxide transistor, which can reduce the influence of the leakage current on the drive current flowing into the electroluminescent component 211, and improve the stability of the luminance. Alternatively, in order to unify the process of fabricating the pixel circuit, the compensation switch transistor M3 may also be a low temperature poly-si thin film transistor. Of course, in the practical application, the implementation of the compensation switch transistor M3 may be designed and determined according to the practical application environment and is not limited herein.

In implementation, in the embodiment of the present disclosure, as shown in FIG. 2, the data switch transistor M2 and the compensation switch transistor M3 are both N-type transistors. Further the data switch transistor M2 and the compensation switch transistor M3 can both set as the metal oxide transistors or the low temperature poly-si thin film transistors, which can reduce the difficulty of the process of fabricating the pixel circuit.

Alternatively, the data switch transistor M2 and the compensation switch transistor M3 may also be both P-type transistors. Further the data switch transistor M2 and the compensation switch transistor M3 can both set as the metal oxide transistors or the low temperature poly-si thin film transistors, which can reduce the difficulty of the process of fabricating the pixel circuit.

In implementation, in the embodiment of the present disclosure, as shown in FIG. 3, the photo detection circuit 213 may further include: a detection capacitor CSF; a gate of the detection switch transistor M4 is coupled with a third scanning signal terminal G3, a first electrode of the detection switch transistor M4 is coupled with a second electrode of the PIN-type photodiode DP, and a second electrode of the detection switch transistor M4 is coupled with an optical detection signal terminal VG; a first electrode of the PIN-type photodiode DP is coupled with a reference voltage terminal VREF; the detection capacitor CSF is coupled between the first electrode and the second electrode of the PIN-type photodiode DP.

In implementation, in the embodiment of the present disclosure, the first electrode of the PIN-type photodiode DP may be the positive electrode of the PIN-type photodiode DP, and the second electrode of the PIN-type photodiode DP may be the negative electrode of the PIN-type photodiode DP.

In implementation, in the embodiment of the present disclosure, when the detection switch transistor M4 is turned on under the control of the signal of the third scanning signal terminal G3, the detection switch transistor M4 can connect the second electrode of the PIN-type photodiode DP to the optical detection signal terminal VG.

In implementation, in the embodiment of the present disclosure, the detection capacitor CSF can store the input voltage.

Figure 4:
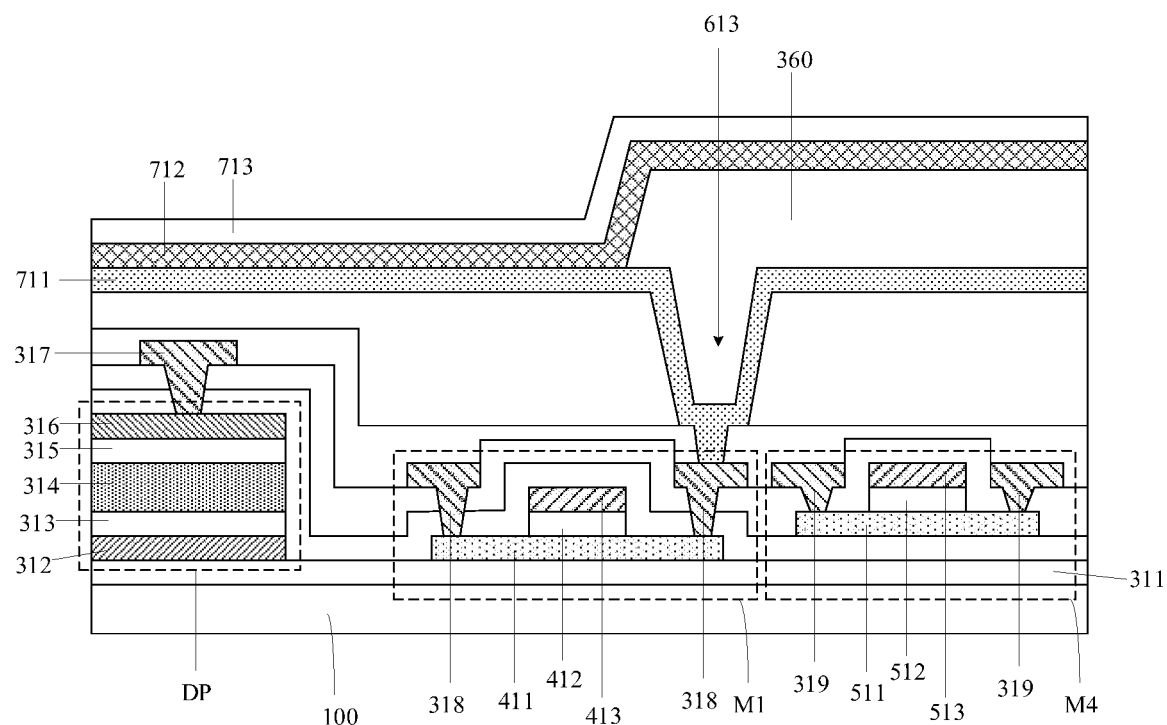
FIG. 4 is a schematic partial sectional view of an array substrate according to an embodiment of the present disclosure.

In implementation, in the embodiment of the present disclosure, transistors being metal oxide transistors may be located on the sides, away from the base substrate, of transistors being low temperature poly-si thin film transistors and the PIN-type photodiodes. Exemplarily, as shown in FIG. 4, taking the drive transistor M1, the detection switch transistor M4 and the PIN-type photodiode DP as an example, the detection switch transistor M4 is located on the side of the drive transistor M1 and the PIN-type photodiode DP away from the base substrate, so as to further avoid the influence of the H atoms in the PIN-type photodiode on the metal oxide transistor.

Figure 5:
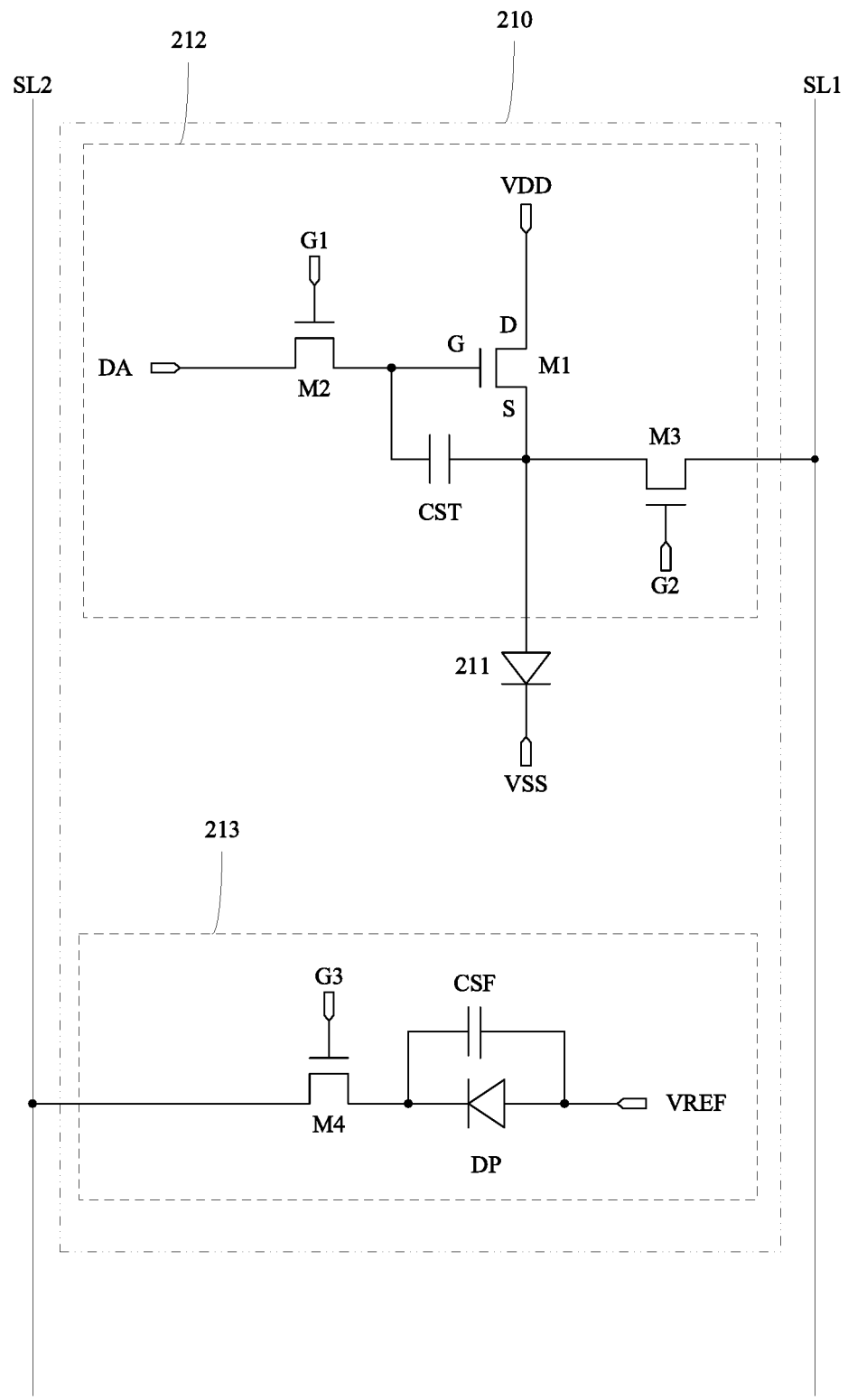
FIG. 5 is a first partial top view of an array substrate according to an embodiment of the present disclosure.

As the use time increases, the drive transistor M1 becomes aged, leading to drift of the threshold voltage Vth and the mobility of the drive transistor M1, and thus causing difference of the display luminance. In implementation, in the embodiment of the present disclosure, as shown in FIGS. 2 and 5, the pixel circuit as shown in FIG. 2 may be used to compensate for the threshold voltage Vth and the mobility of the drive transistor M1 through external compensation. In this way, a first detection line SL1 also needs to be arranged in the array substrate, so that the first electrode of the compensation switch transistor M3 is coupled with the first detection line SL1. And, a plurality of first detection lines SL1 may be arranged in the array substrate, and the first electrodes of the compensation switch transistors M3 of the pixel circuits in one column of sub-pixels 210 are coupled with one of the first detection lines SL1. Further, a plurality of second detection lines SL2 may be arranged in the array substrate, and the second electrodes of the detection switch transistors M4 of the photo detection circuits 213 in one column of sub-pixels 210 are coupled with one of the second detection lines SL2, thus the light-emitting of the electroluminescent components 211 can be detected through the PIN-type photodiodes DP to compensate for the light-emitting of the electroluminescent components 211.

Figure 6A:
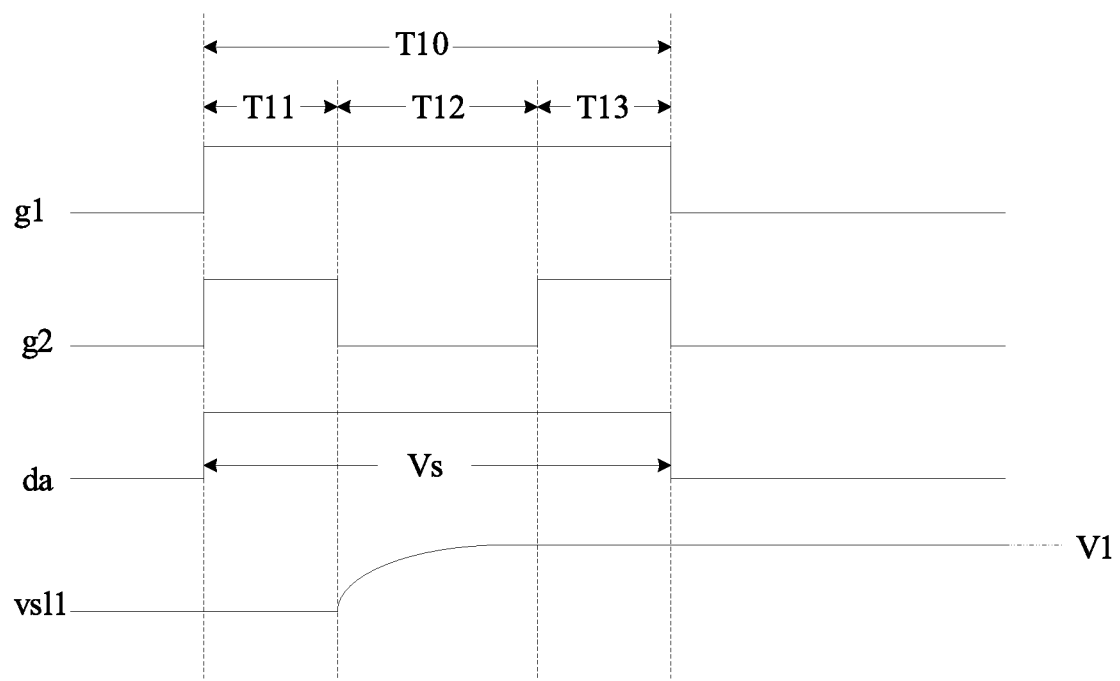
FIG. 6a is a first circuit timing diagram according to an embodiment of the present disclosure.
Figure 6B:
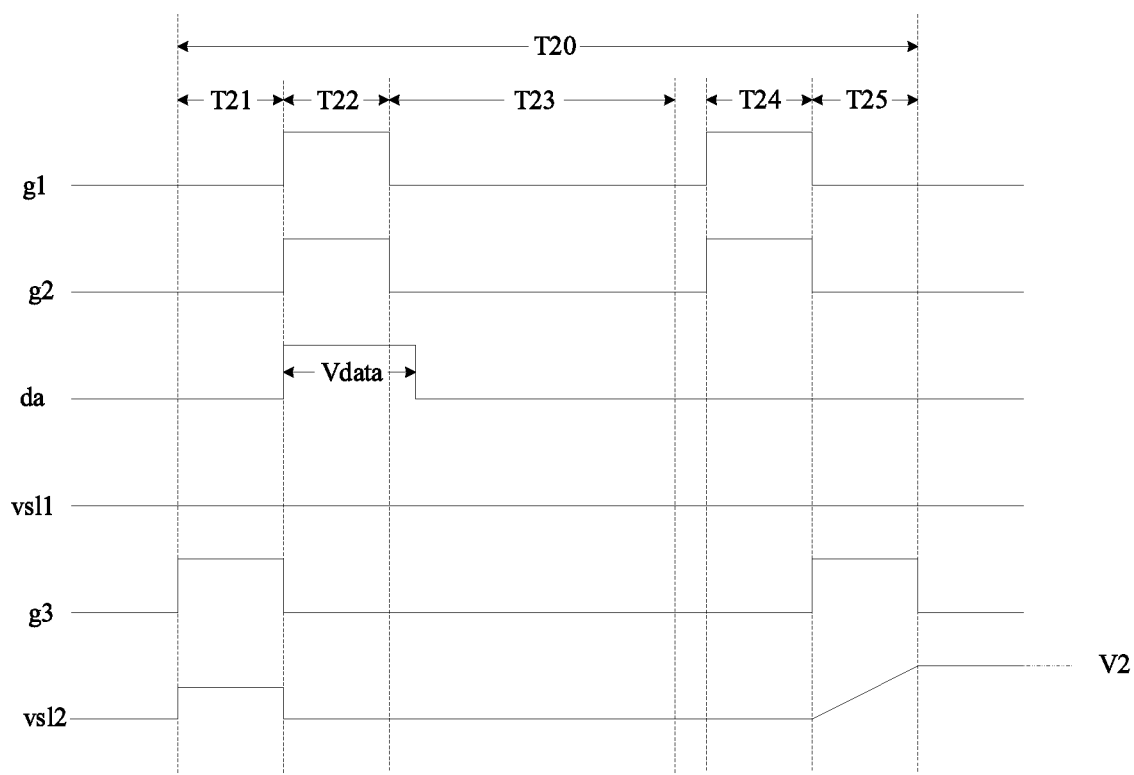
FIG. 6b is a second circuit timing diagram according to an embodiment of the present disclosure.

The operation process of the array substrate according to the embodiment of the present disclosure is described below in combination with the circuit timing diagrams as shown in FIGS. 6a and 6b, with the circuit structure of one sub-pixel 210 as shown in FIG. 5 as an example. In FIGS. 6a and 6b, g1 represents the signal of the first scanning signal terminal G1, g2 represents the signal of the second scanning signal terminal G2, g3 represents the signal of the third scanning signal terminal G3, da represents the signal of the data signal terminal DA, Vdata represents the data voltage of the data signal terminal DA, vsl1 represents the voltage on the first detection line SL1, and vsl2 represents the voltage on the second detection line SL2. Specifically, the electrical compensation period T10 in FIG. 6a and the optical compensation period T20 in FIG. 6b are selected. The electrical compensation period T10 may include: periods T11, T12 and T13. The optical compensation period T20 may include: periods T21, T22, T23, T24 and T25.

In the period T11, the data switch transistor M2 is turned on under the control of high level of the signal g1 of the first scanning signal terminal G1, so as to provide the data voltage Vs to the gate G of the drive transistor M1, and the storage capacitor CST stores the data voltage. The compensation switch transistor M3 is turned on under the control of high level of the signal g2 of the second scanning signal terminal G2, so as to provide the reference voltage signal on the first detection line SL1 to the first terminal of the electroluminescent component 211, so as to reset the electroluminescent component 211. The voltage value of the reference voltage signal may be smaller than the voltage value of the signal of the second power terminal VSS, so that the electroluminescent component 211 is in the reverse bias state and the characteristics of the electroluminescent component 211 are recovered.

In the period T12, the data switch transistor M2 is turned on under the control of high level of the signal g1 of the first scanning signal terminal G1, so as to provide the data voltage Vs to the gate G of the drive transistor M1, and the storage capacitor CST stores the data voltage. The compensation switch transistor M3 is turned off under the control of low level of the signal g2 of the second scanning signal terminal G2. The drive transistor M1 generates the drive current I under the joint control of the gate voltage and source voltage of the drive transistor M1, and the drive current I satisfies the formula: $I=K[V_{gs}-V_{th}]^2=K[V_{data}-vsl1-V_{th}]^2$; wherein, $K=\frac{1}{2}\mu_n C_{ox} W/L$, $\mu_n$ represents the mobility of the drive transistor M1, $C_{ox}$ represents the gate oxide capacitance per unit area, and W/L represents the width-to-length ratio of the drive transistor M1. In the same structure, the values in the same structure are relatively stable and can be considered as constants. In this way, the first terminal of the electroluminescent component 211 is charged through the drive current I, so that the voltage of the first terminal of the electroluminescent component 211 rises to V1.

In the period T13, the data switch transistor M2 is turned on under the control of high level of the signal g1 of the first scanning signal terminal G1, so as to provide the data voltage Vs to the gate G of the drive transistor M1, and the storage capacitor CST stores the data voltage. The compensation switch transistor M3 is turned on under the control of high level of the signal g2 of the second scanning signal terminal G2, so as to provide the voltage V1 of the first terminal of the electroluminescent component 211 to the first detection line SL1. Therefore, the first detection voltage V1 is obtained by the driving integrated circuit (IC), so as to perform compensation analysis calculation through the first detection voltage V1 and improve the screen display effect. Since the drive transistor M1 is a low temperature poly-si thin film transistor, so that the influence of the H atoms of the PIN-type photodiode can be avoided, and the stability of the drive transistor M1 is improved. Accordingly, the stability of the drive current I generated by the drive transistor M1 can be improved, and thus the display effect is further improved. Besides the detection switch transistor M4 is turned off under the control of low level of the signal g3 of the third scanning signal terminal G3.

In the period T21, the detection switch transistor M4 is turned on under the control of high level of the signal g3 of the third scanning signal terminal G3, so as to connect the second electrode of the PIN-type photodiode DP to the second detection line SL2, so that the positive voltage is loaded on the second electrode of the PIN-type photodiode DP. And the negative voltage (e.g. −5V) is loaded on the reference voltage terminal VREF, so that the negative voltage is loaded on the first electrode of the PIN-type photodiode DP, and the PIN-type photodiode DP operates in the reverse bias state. Besides the data switch transistor M2 is turned off under the control of low level of the signal g1 of the first scanning signal terminal G1, and the compensation switch transistor M3 is turned off under the control of low level of the signal g2 of the second scanning signal terminal G2.

In the period T22, the data switch transistor M2 is turned on under the control of high level of the signal g1 of the first scanning signal terminal G1, and the compensation switch transistor M3 is turned on under the control of high level of the signal g2 of the second scanning signal terminal G2. The turned-on data switch transistor M2 provides the input data voltage Vdata to the gate G of the drive transistor M1, so that the voltage of the gate G of the drive transistor M1 is Vdata. The turned-on compensation switch transistor M3 provides the reference voltage signal (e.g. 0V) transmitted on the first detection line SL1 to the electroluminescent component 211. The voltage value of the reference voltage signal may be smaller than the voltage value of the signal of the second power terminal VSS, so that the electroluminescent component 211 is in the reverse bias state and the characteristics of the electroluminescent component 211 are recovered. Besides the detection switch transistor M4 is turned off under the control of low level of the signal g3 of the third scanning signal terminal G3.

In the period T23, the data switch transistor M2 is turned off under the control of low level of the signal g1 of the first scanning signal terminal G1, and the compensation switch transistor M3 is turned off under the control of low level of the signal g2 of the second scanning signal terminal G2. The detection switch transistor M4 is turned off under the control of low level of the signal g3 of the third scanning signal terminal G3. The drive transistor M1 generates the drive current I under the joint control of the gate voltage and source voltage of the drive transistor M1, and the drive current I satisfies the formula: $I=K[Vgs-Vth]^2=K[Vdata-Vs-Vth]^2$; wherein Vs represents the source voltage of the drive transistor M1, $$K = \frac{1}{2}\mu_n C_{ox} \frac{W}{L},$$

$\mu_n$ represents the mobility of the drive transistor M1, $C_{ox}$ represents the gate oxide capacitance per unit area, and $$\frac{W}{L}$$

represents the width-to-length ratio of the drive transistor M1. In the same structure, the values are relatively stable and may be considered as constants. In this way, the drive current I generated by the drive transistor M1 can drive the electroluminescent component 211 to emit light, so that the PIN-type photodiode DP can receive the light emitted by the electroluminescent component 211 and converts the received light into current, and the voltage of the second electrode of the PIN-type photodiode DP can change.

In the period T24, the data switch transistor M2 is turned on under the control of high level of the signal g1 of the first scanning signal terminal G1, and the compensation switch transistor M3 is turned on under the control of high level of the signal g2 of the second scanning signal terminal G2. The turned-on data switch transistor M2 provides the 0V data voltage Vdata to the gate G of the drive transistor M1. And the turned-on compensation switch transistor M3 provides the reference voltage signal (e.g. 0V) transmitted on the first detection line SL1 to the electroluminescent component 211. In this way, the electroluminescent component 211 can stop emitting light to ensure the voltage of the second electrode of the PIN-type photodiode DP to be stable.

In the period T25, the detection switch transistor M4 is turned on under the control of high level of the signal g3 of the third scanning signal terminal G3, to connect the PIN-type photodiode DP to the second detection line SL2, thus the voltage of the second electrode of the PIN-type photodiode DP is transmitted to the second detection line SL2 to enable the second detection voltage V2 is loaded on the second detection line SL2. Therefore, the driving IC obtains the second detection voltage V2, so as to perform compensation analysis calculation through the second detection voltage V2 and improve the screen display effect. Since the detection switch transistor M4 is a metal oxide transistor, the influence of the leakage current can be reduced, the accuracy of the detection result can be improved, and thus the display effect can be improved.

It should be noted that the electrical compensation period T10 may be performed when the display device is started up or shut down, and the optical compensation period T20 may be performed when the display device is started up. Of course, in the practical application, the electrical compensation period T10 and the optical compensation period T20 may be designed and determined according to the practical application environment and are not limited herein.

Figure 7:
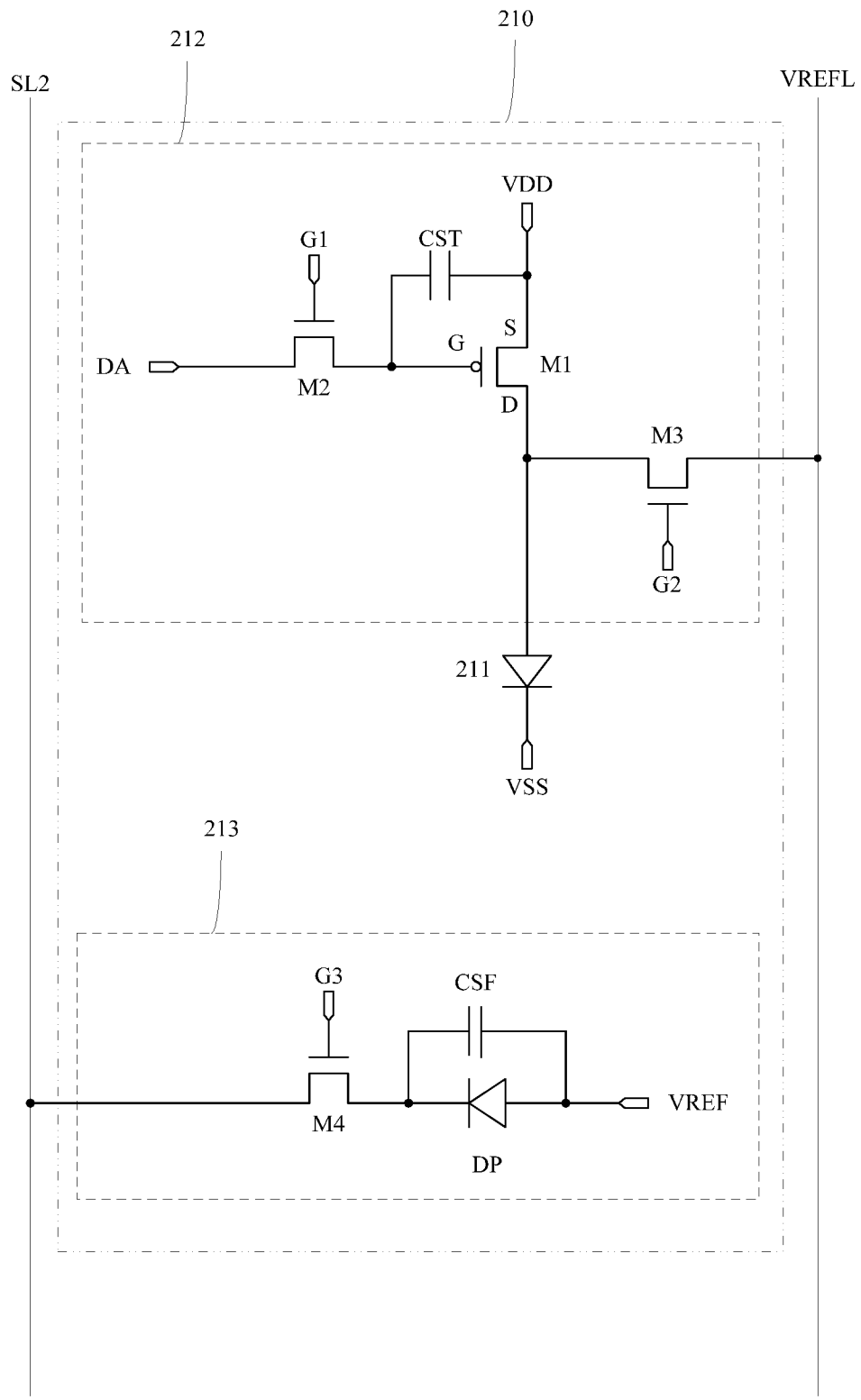
FIG. 7 is a second partial top view of an array substrate according to an embodiment of the present disclosure.

The structural diagram of another array substrate in the embodiment of the present disclosure is as shown in FIG. 7, which is a modification of the implementation as shown in FIG. 5. Only the differences between the present embodiment and the embodiment in FIG. 5 are described below, and the similarities thereof are not described again here.

In implementation, in the embodiment of the present disclosure, as shown in FIG. 7, the drive transistor M1 may be a P-type transistor. The first electrode of the drive transistor M1 is the source S thereof, the second electrode of the drive transistor M1 is the drain D thereof, and when the drive transistor M1 is saturated, the current flows from the source S of the drive transistor M1 to the drain D of the drive transistor M1, so that the electroluminescent component 211 emits light under the drive current when the drive transistor M1 is saturated.

In implementation, in the embodiment of the present disclosure, as shown in FIG. 7, the pixel circuit 212 may further include: a storage capacitor CST. The storage capacitor CST is coupled between the gate G of the drive transistor M1 and the first electrode of the drive transistor M1. That is, the storage capacitor CST is coupled between the gate G of the drive transistor M1 and the source S of the drive transistor M1 to store the voltage input to the storage capacitor CST.

In implementation, in the embodiment of the present disclosure, as shown in FIG. 7, a reference signal line VREFL may also be arranged in the array substrate, and the first electrodes of the compensation switch transistors M3 of the pixel circuits 212 in all the sub-pixels 210 are coupled with the reference signal line VREFL.

Figure 8:
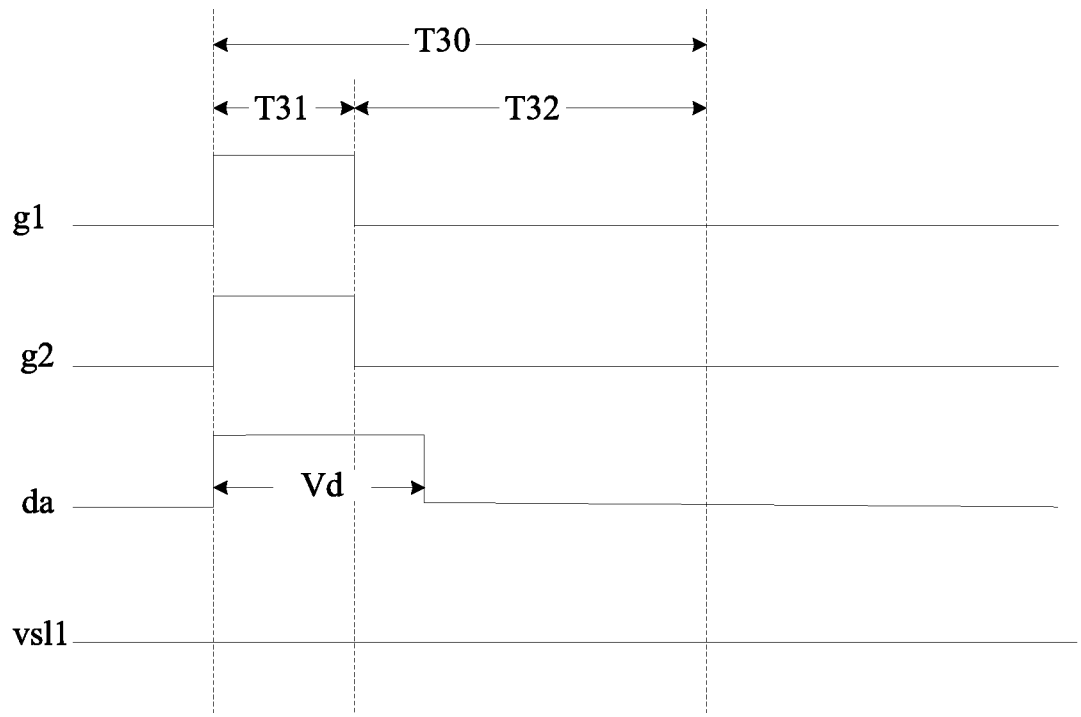
FIG. 8 is a third circuit timing diagram according to an embodiment of the present disclosure.

The operation process of the array substrate according to the embodiment of the present disclosure is described below in combination with the circuit timing diagrams as shown in FIGS. 8 and 6b, with the circuit structure of one sub-pixel 210 as shown in FIG. 7 as an example. In FIGS. 8 and 6b, g1 represents the signal of the first scanning signal terminal G1, g2 represents the signal of the second scanning signal terminal G2, g3 represents the signal of the third scanning signal terminal G3, da represents the signal of the data signal terminal DA, Vdata represents the data voltage of the data signal terminal DA, and vsl2 represents the voltage on the second detection line SL2. Specifically, the display period T30 in FIG. 8 and the optical compensation period T20 in FIG. 6b are selected. The display period T30 may include: periods T31 and T32. The optical compensation period T20 may include: periods T21, T22, T23, T24 and T25.

In the period T31, the data switch transistor M2 is turned on under the control of high level of the signal g1 of the first scanning signal terminal G1, so as to provide the data voltage Vd to the gate G of the drive transistor M1, and the storage capacitor CST stores the data voltage. The compensation switch transistor M3 is turned on under the control of high level of the signal g2 of the second scanning signal terminal G2, so as to provide the reference voltage signal on the reference signal line VREFL to the first terminal of the electroluminescent component 211 so as to reset the electroluminescent component 211. The voltage value of the reference voltage signal may be smaller than the voltage value of the signal of the second power terminal VSS, so that the electroluminescent component 211 is in the reverse bias state and the characteristics of the electroluminescent component 211 are recovered.

In the period T32, the data switch transistor M2 is turned off under the control of low level of the signal g1 of the first scanning signal terminal G1, and the compensation switch transistor M3 is turned off under the control of low level of the signal g2 of the second scanning signal terminal G2. The drive transistor M1 generates the drive current I under the joint control of the gate voltage and source voltage of the drive transistor M1, and the drive current I satisfies the formula: $I=K[Vgs-Vth]^2=K[Vdata-vdd-Vth]^2$; wherein vdd represents the voltage of the first power terminal VDD, and $$K = \frac{1}{2}\mu_n C_{ox} \frac{W}{L}.$$

In this way, the drive current I drives the electroluminescent component 211 to emit light. Since the drive transistor M1 is a low temperature poly-si thin film transistor, the influence of the H atoms of the PIN-type photodiode can be avoided, so that the stability of the drive transistor M1 is improved, accordingly the stability of the drive current generated by the drive transistor M1 can be improved, and thus the display effect is further improved.

The operation process of the circuit structure as shown in FIG. 7 in the optical compensation period T20 can be reference to the above process and is not described again here.

Figure 9:
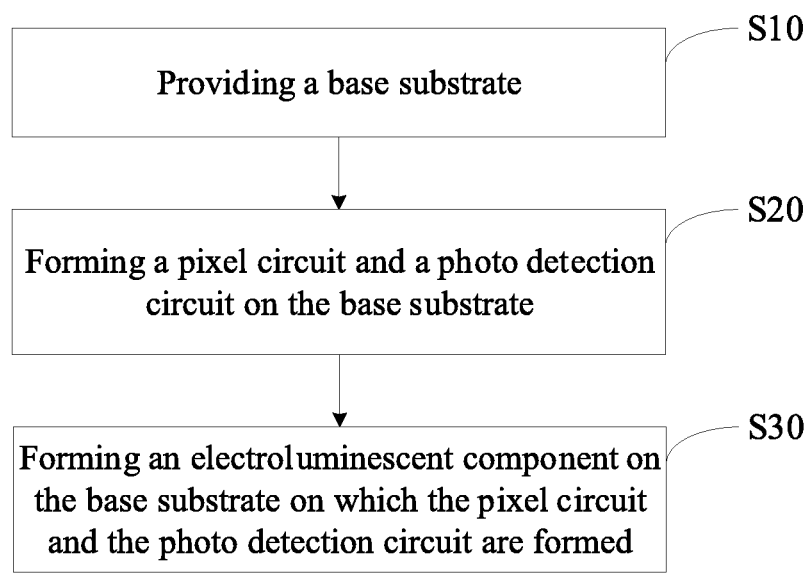
FIG. 9 is a first flow chart of a fabrication method of an array substrate according to an embodiment of the present disclosure.

On the basis of the same inventive concept, the embodiment of the present disclosure also provides a fabrication method of the array substrate, as shown in FIG. 9, which may include the following steps.

S10: Providing a base substrate.

S20: Forming pixel circuits and photo detection circuits on the base substrate. S30: Forming electroluminescent components on the base substrate on which the pixel circuits and the photo detection circuits are formed.

In the fabrication method provided by the embodiment of the present disclosure, the electroluminescent components, the pixel circuits and the photo detection circuits are formed on the base substrate, since a low temperature poly-si thin film transistor (LTPS TFT) has stable performance under the effect of the H atoms, by using the low temperature poly-si thin film transistor as the drive transistor in the pixel circuit, the influence of the H atoms of the PIN-type photodiode can be avoided, so that the drive transistor stability can be improved, accordingly the stability of the drive current generated by the drive transistor is improved, and thus the display effect is further improved. In addition, since a metal oxide transistor has low off leakage current, by using the metal oxide transistor as the detection switch transistor, the influence of the leakage current can be reduced, the accuracy of the detection result can be improved, and thus the display effect can be improved.

In implementation, in the embodiment of the present disclosure, the structures of the pixel circuits and the photo detection circuits which are formed on the base substrate may be basically the same as the structures of the pixel circuits and the photo detection circuits in the implementation of the above base substrate, and are thus not described again here.

Figure 10:
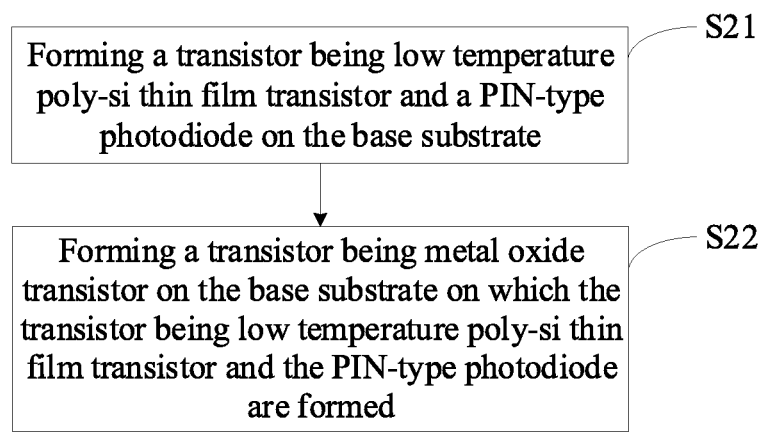
FIG. 10 is a second flow chart of a fabrication method of an array substrate according to an embodiment of the present disclosure.

In implementation, in the embodiment of the present disclosure, the step S20 of forming pixel circuits and photo detection circuits on the base substrate, as shown in FIG. 10, may include the following steps.

S21: Forming a transistor which is a low temperature poly-si thin film transistor and a PIN-type photodiode on the base substrate.

S22: Forming a transistor which is a metal oxide transistor on the base substrate on which the transistor which is the low temperature poly-si thin film transistor and the PIN-type photodiodes are formed.

In implementation, in the embodiment of the present disclosure, the step S21 of forming the transistor which is the low temperature poly-si thin film transistor and PIN-type photodiodes on the base substrate may include the following steps.

S2101: Forming a first electrode on the base substrate.

S2102: Forming a polysilicon layer on the base substrate; wherein the polysilicon layers is spaced from the first electrode.

S2103: Forming a first amorphous silicon layer on the first electrode; wherein the orthographic projection of the first amorphous silicon layer on the base substrate overlaps with the orthographic projection of the first electrode on the base substrate.

S2104: Perform ion doping the polysilicon layer and the first amorphous silicon layer; wherein B ion doping may be performed on the polysilicon layer and the first amorphous silicon layer.

S2105: Forming a second amorphous silicon layer on the first amorphous silicon layer, wherein the orthographic projection of the second amorphous silicon layer on the base substrate overlaps with the orthographic projection of the first electrode on the base substrate; and the thickness of the second amorphous silicon layer is larger than the thickness of the first amorphous silicon layer.

S2106: Forming a first gate insulation layer and a first gate sequentially on the polysilicon layer and exposing a source region and a drain region of the polysilicon layer. The orthographic projection of the first gate insulation layer and the first gate on the base substrate covers a channel region of the polysilicon layer; the source region and the drain region of the polysilicon layer are respectively located on the two sides of the channel region of the polysilicon layer.

S2107: Forming a third amorphous silicon layer on the second amorphous silicon layer. The orthographic projection of the third amorphous silicon layer on the base substrate overlaps with the orthographic projection of the first electrode on the base substrate; and the thickness of the second amorphous silicon layer is larger than the thickness of the third amorphous silicon layer.

S2108: Performing ion doping on the source region and the drain region of the polysilicon layer and the third amorphous silicon layer for the second time, so that the source region and the drain region of the polysilicon layer form a conductor; wherein P ion doping may be performed on the source region and the drain region of the polysilicon layer and the third amorphous silicon layer.

S2109: Forming a second electrode on the third amorphous silicon layer; wherein the orthographic projection of the second electrode on the base substrate overlaps with the orthographic projection of the first electrode on the base substrate.

S2110: Forming a first interlayer dielectric layer on the base substrate on which the second electrode is formed; wherein the first interlayer dielectric layer covers the base substrate.

Figure 11:
FIG. 11 is a third flow chart of a fabrication method of an array substrate according to an embodiment of the present disclosure.

In implementation, in the embodiment of the present disclosure, the step S22 of forming the transistor being metal oxide transistor on the base substrate on which the transistor being low temperature poly-si thin film transistor and the PIN-type photodiodes are formed, as shown in FIG. 11, may include the following steps.

S2201: Forming a metal oxide semiconductor layer, a second gate insulation layer and a second gate sequentially on the first interlayer dielectric layer and exposing the source region and the drain region of the metal oxide semiconductor layer. The orthographic projection of the second gate insulation layer and the second gate on the base substrate covers the channel region of the metal oxide semiconductor layer.

S2202: Forming a second interlayer dielectric layer on the base substrate on which the metal oxide semiconductor layer, the second gate insulation layer and the second gate are formed.

S2203: Forming first via holes penetrating through the first interlayer dielectric layer and the second interlayer dielectric layer and second via holes penetrating through the second interlayer dielectric layer through etching.

S2204: Forming a plurality of first connection portions, second connection portions and third connection portions which are spaced on the second interlayer dielectric layer, so that the second electrode is electrically connected with the corresponding first connection portion through the first via hole, the source region and the drain region of the polysilicon layer are respectively electrically connected with the corresponding second connection portions through the first via holes, and the source region and the drain region of the metal oxide semiconductor layer are respectively electrically connected with the corresponding third connection portions through the second via holes. One PIN-type photodiode corresponds to one first connection portion, one low temperature poly-si thin film transistor corresponds to two second connection portions, and one metal oxide transistor corresponds to two third connection portions.

In implementation, in the embodiment of the present disclosure, before the first electrode is formed on the base substrate, the fabrication method further includes a step of forming a buffer layer covering the base substrate.

Taking the drive transistor M1, the detection switch transistor M4 and the PIN-type photodiode DP as an example, the fabrication method of the array substrate is illustrated by the way of an embodiment; however, it is known to the reader that the specific process is not limited hereto.

The fabrication method of the array substrate according to the embodiment of the present disclosure may include the following steps.

(1) A base substrate is provided. The base substrate may be a glass substrate or a flexible substrate.

Figure 12A:
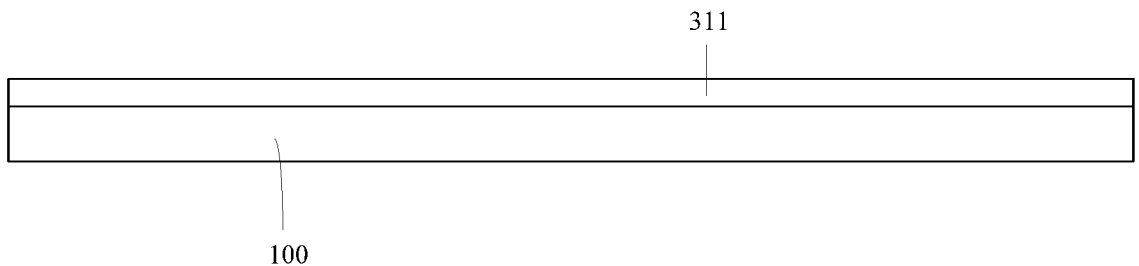
FIGS. 12a-12m are respectively the sectional structural diagrams of the array substrate obtained in various steps of the fabrication method according to the embodiment of the present disclosure.

(2) A buffer layer 311 is formed on the base substrate 100 through deposition, as shown in FIG. 12a.

Figure 12B:

(3) A first electrode 312 of the PIN-type photodiode DP is formed on the buffer layer 311 through deposition, as shown in FIG. 12b. The first electrode 312 may be a reflecting electrode. Specifically, the first electrode 312 may be made of a metal material, like Al, Cu, Ag and Au.

Figure 12C:
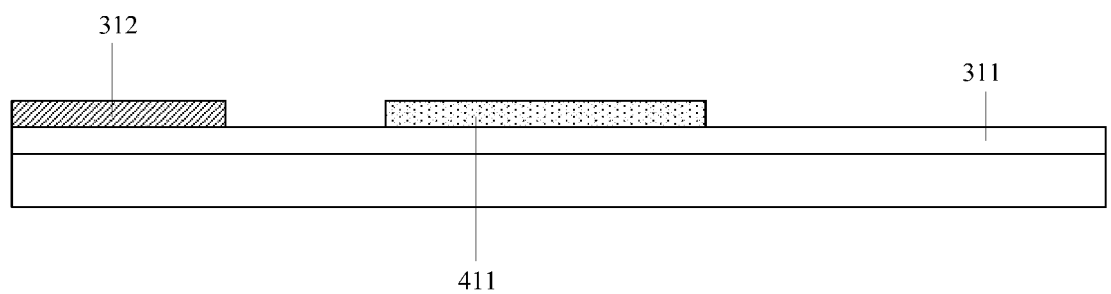

(4) A polysilicon layer 411 of an LTPS transistor is formed on the buffer layer 311. As shown in FIG. 12c, the polysilicon layer 411 is spaced from the first electrode 312, so as to insulate the polysilicon layer 411 from the first electrode 312.

Specifically, the amorphous silicon semiconductor layer of the LTPS transistor is formed on the buffer layer 311 and patterned, then dehydrogenation and laser crystallization are performed on the amorphous silicon semiconductor layer, so that the amorphous silicon semiconductor layer forms into the polysilicon layer 411.

Figure 12D:
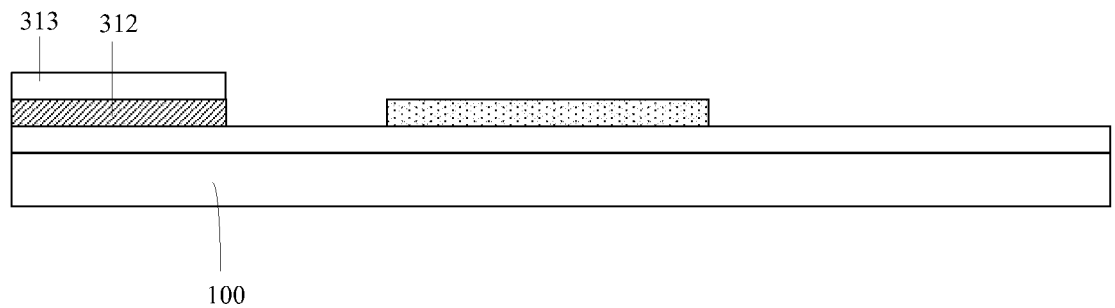

(5) A first amorphous silicon layer 313 of the PIN-type photodiode DP is formed on the first electrode 312 through deposition. As shown in FIG. 12d, the orthographic projection of the first amorphous silicon layer 313 on the base substrate 100 overlaps with the orthographic projection of the first electrode 312 on the base substrate 100.

(6) B ion doping is performed on the polysilicon layer 411 and the first amorphous silicon layer 313.

Figure 12E:
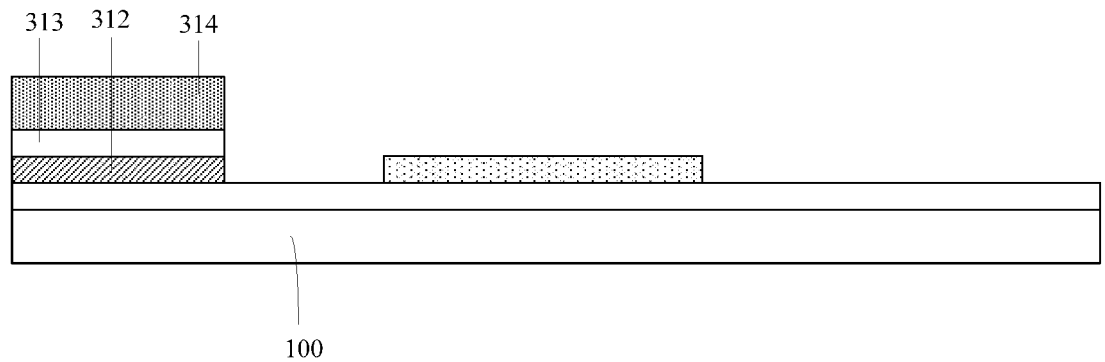

(7) A second amorphous silicon layer 314 of the PIN-type photodiode is formed on the first amorphous silicon layer 313 through deposition. As shown in FIG. 12e, the orthographic projection of the second amorphous silicon layer 314 on the base substrate 100 overlaps with the orthographic projection of the first electrode 312 on the base substrate 100. The thickness of the second amorphous silicon layer 314 is larger than the thickness of the first amorphous silicon layer 313.

Figure 12F:
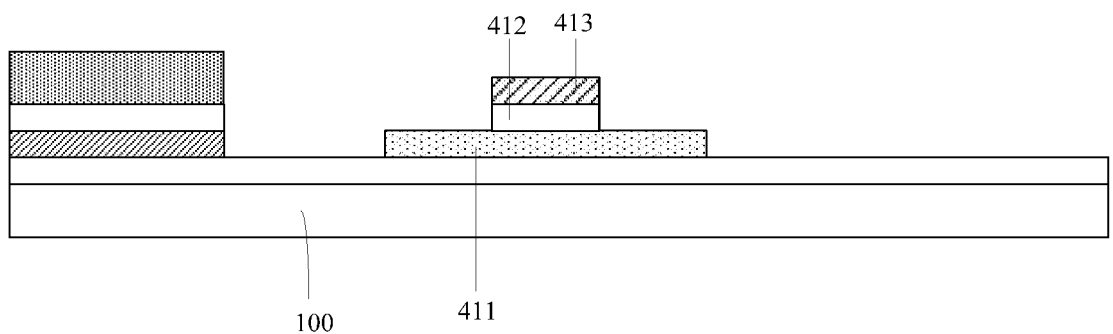

(8) A first gate insulation layer 412 and a first gate 413 of the LTPS transistor are sequentially formed on the polysilicon layer 411 through deposition, and the source region and the drain region of the polysilicon layer 411 are exposed. As shown in FIG. 12f, the orthographic projection of the first gate insulation layer 412 and the first gate 413 on the base substrate 100 covers the channel region of the polysilicon layer 411; the source region and the drain region of the polysilicon layer 411 are respectively located on the two sides of the channel region of the polysilicon layer 411.

Figure 12G:
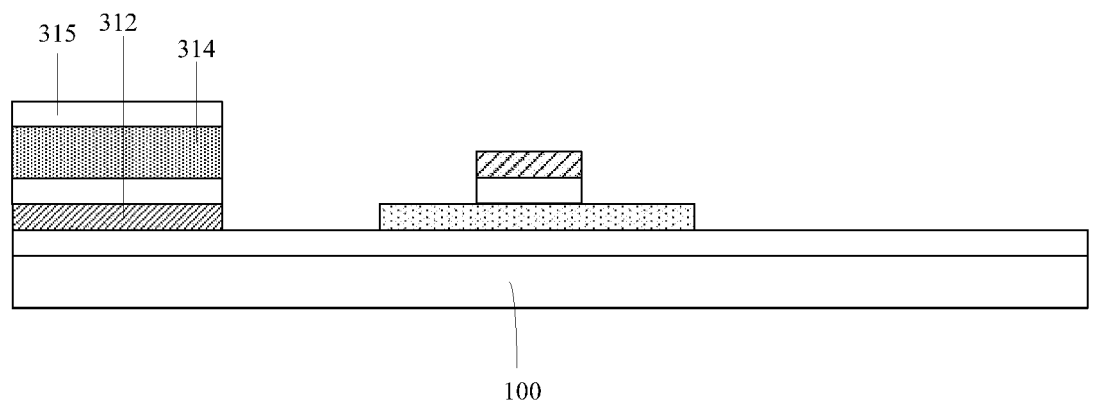

(9) A third amorphous silicon layer 315 of the PIN-type photodiode is formed on the second amorphous silicon layer 314 through deposition. As shown in FIG. 12g, the orthographic projection of the third amorphous silicon layer 315 on the base substrate 100 overlaps with the orthographic projection of the first electrode 312 on the base substrate 100. The thickness of the second amorphous silicon layer 314 is larger than the thickness of the third amorphous silicon layer 315.

(10) P ion doping is performed on the source region and the drain region of the polysilicon layer 411 and the third amorphous silicon layer 315.

Figure 12H:
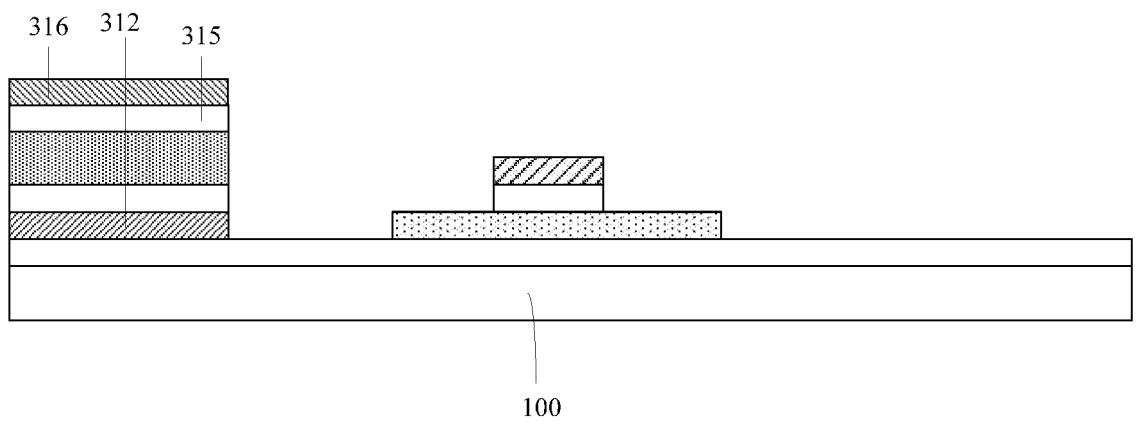

(11) A second electrode 316 is formed on the third amorphous silicon layer 315 through deposition. As shown in FIG. 12h, the orthographic projection of the second electrode 316 on the base substrate 100 overlaps with the orthographic projection of the first electrode 312 on the base substrate 100. Specifically, the second electrode 316 may be made of a transparent conductive material, such as indium tin oxide (ITO) material, indium zinc oxide (IZO) material, carbon nanotubes and grapheme and so on. In this way, the second electrode 316 can be a transparent electrode, so as to sense the light emitted from the electroluminescent component.

Figure 12I:
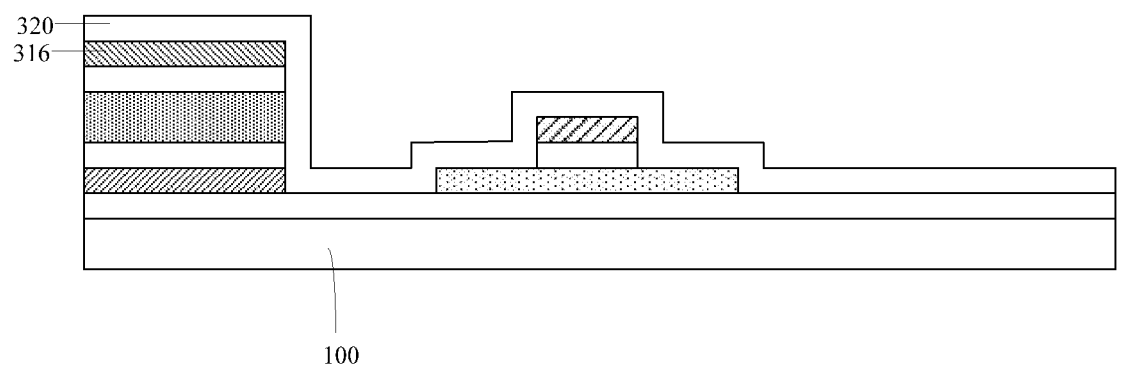

(12) A first interlayer dielectric layer 320 covering the base substrate 100 is formed on the base substrate 100 on which the second electrode 316 is formed, as shown in FIG. 12i.

Figure 12J:
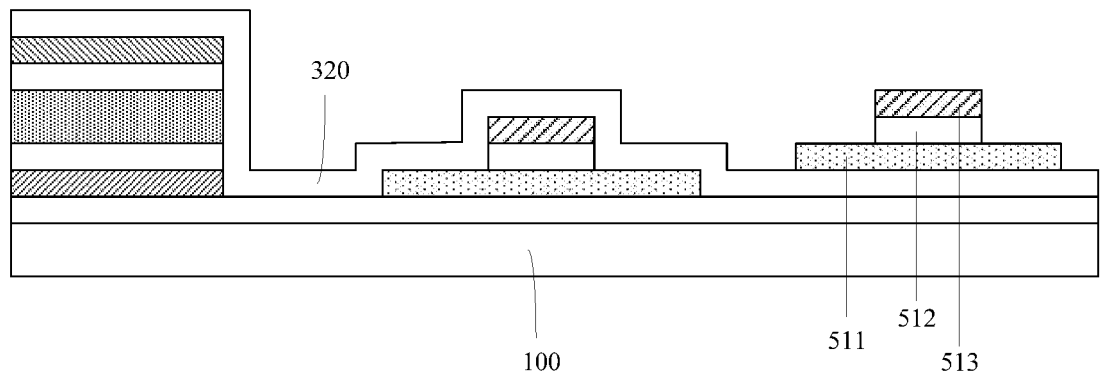

(13) A metal oxide semiconductor layer 511, a second gate insulation layer 512 and a second gate 513 of the metal oxide transistor are sequentially formed on the first interlayer dielectric layer 320, and the source region and the drain region of the metal oxide semiconductor layer 511 are exposed. As shown in FIG. 12j, the orthographic projection of the second gate insulation layer 512 and the second gate 513 on the base substrate 100 covers the channel region of the metal oxide semiconductor layer 511. The source region and the drain region of the metal oxide semiconductor layer 511 are doped with corresponding ions to form conductors. Exemplarily, the metal oxide semiconductor layer 511 may be made of indium gallium zinc oxide (IGZO).

Figure 12K:
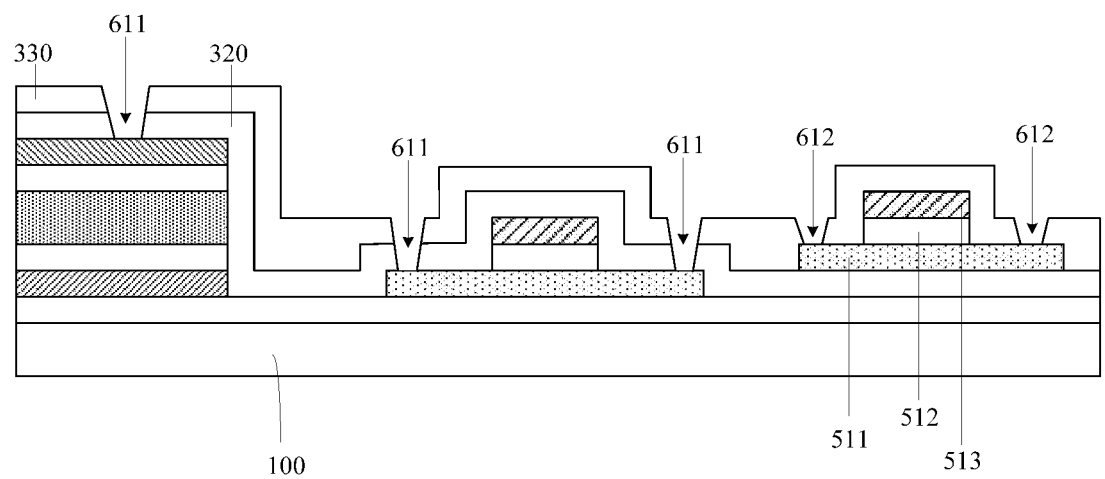

(14) A second interlayer dielectric layer 330 covering the base substrate 100 is formed on the base substrate 100 on which the metal oxide semiconductor layer 511, the second gate insulation layer 512 and the second gate 513 are formed, as shown in FIG. 12k.

(15) A plurality of first via holes 611 penetrating through the first interlayer dielectric layer 320 and the second interlayer dielectric layer 330 and a plurality of second via holes 612 penetrating through the second interlayer dielectric layer are formed through etching, as shown in FIG. 12k. One PIN-type photodiode corresponds to one first via hole 611, one LTPS transistor corresponds to two first via holes 611, and one metal oxide transistor corresponds to two second via holes 612.

Figure 12L:
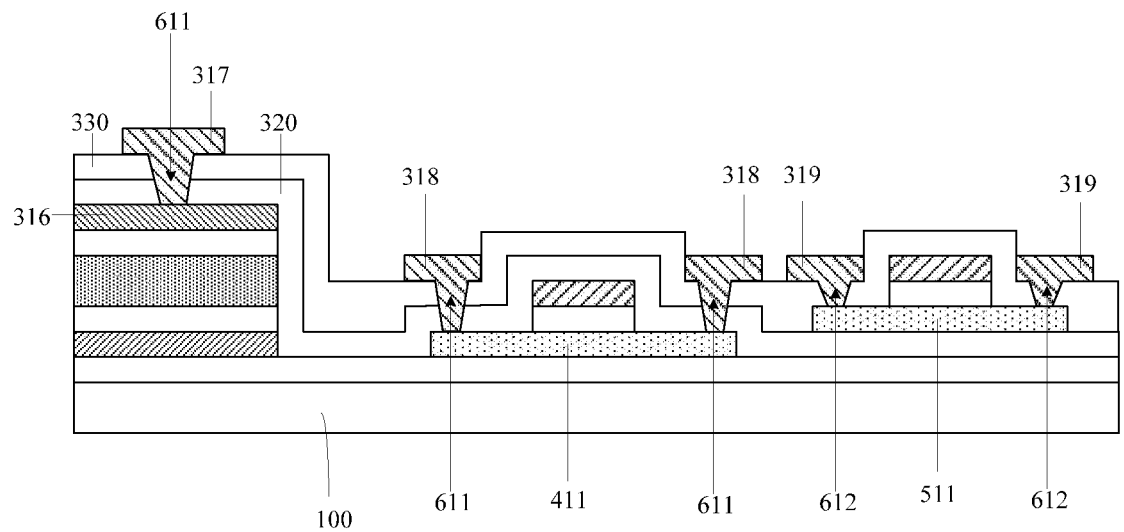

(16) A plurality of first connection portions 317, second connection portions 318 and third connection portions 319 which are spaced are formed on the second interlayer dielectric layer 330 through deposition, so that the second electrode 316 is electrically connected with the corresponding first connection portion 317 through the one first via hole 611, the source region and the drain region of the polysilicon layer 411 are electrically connected with the corresponding second connection portions 318 through the two first via holes 611 respectively, and the source region and the drain region of the metal oxide semiconductor layer 511 are electrically connected with the corresponding third connection portions 319 through the two second via holes 612 respectively, as shown in FIG. 12l.

Figure 12M:
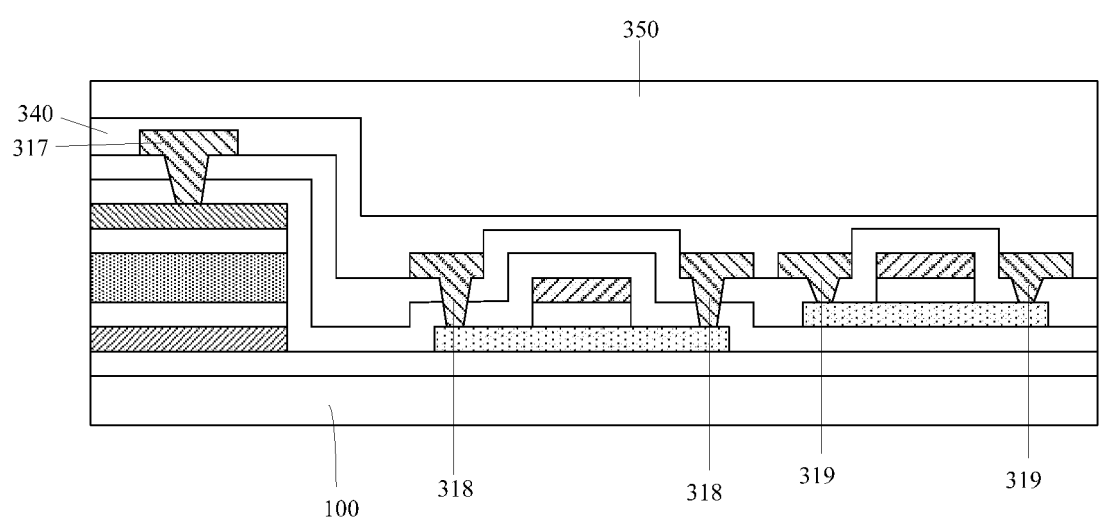

(17) An interlayer insulation layer 340 and a planarization layer 350 which cover the base substrate 100 are formed on the base substrate 100 on which the first connection portions 317, the second connection portions 318 and the third connection portions 319 are formed, as shown in FIG. 12m.

(18) An anode 711, a pixel defining layer 360, a light emitting function layer 712 and a cathode 713 are formed on the planarization layer 350 through deposition, as shown in FIG. 4. The anode 711, the light emitting function layer 712 and the cathode 713 form the electroluminescent component. The anode 711 is electrically connected with the second electrode of the drive transistor M1 by a third via hole 613 penetrating through the interlayer insulation layer 340 and the planarization layer 350. The anode 711 may have a single-layer or multi-layer stacked structure. Exemplarily, e.g. the anode 711 may have an ITO/Ag/ITO stacked structure. The cathode 713 may be made of a transparent conductive material, such as indium tin oxide (ITO) material, indium zinc oxide (IZO) material, carbon nanotubes and grapheme and the like.

As shown in FIG. 4, through the above steps, the first electrode 312, the first amorphous silicon layer 313, the second amorphous silicon layer 314, the third amorphous silicon layer 315 and the second electrode 316 can form the PIN-type photodiode DP. In this way, the polysilicon layer 411, the first gate insulation layer 412, the first gate 413 and the ion-doped source region and drain region of the polysilicon layer 411 can form the drive transistor M1 which is the LTPS transistor. The metal oxide semiconductor layer 511, the second gate insulation layer 512, the second gate 513 and the ion-doped source region and drain region of the metal oxide semiconductor layer 511 can form the detection switch transistor M4 which is the metal oxide transistor.

Based on the same inventive concept, the embodiment of the present disclosure also provides a display device including the above array substrate according to the embodiment of the present disclosure. The display device solves the problem using the similar principle to the above array substrate; therefore, the implementation of the display device can be reference to the implementation of the above array substrate, and repetitions are not described herein.

In implementation, in the embodiment of the present disclosure, the display device may be any product or component with the display function, such as a mobile phone, a tablet computer, a television, a display, a laptop, a digital photo frame and a navigator. Other essential components of the display device should be understood by those of ordinary skilled in the art, and are not described in detail herein, nor should they be taken as limitations to the present disclosure.

In the array substrate, the fabrication method thereof, and the display device according to the embodiment of the disclosure, since a low temperature poly-si thin film transistor (LTPS TFT) has stable performance under the effect of the H atoms, by using the low temperature poly-si thin film transistor as the drive transistor in the pixel circuit, the influence of the H atoms of the PIN-type photodiode can be avoided, so that the drive transistor stability is improved, accordingly the stability of the drive current generated by the drive transistor can be improved, and thus the display effect is further improved. In addition, since a metal oxide transistor has low off leakage current, by using the metal oxide transistor as the detection switch transistor, the influence of the leakage current can be reduced, the accuracy of the detection result can be improved, and thus the display effect can be improved.

Evidently those skilled in the art can make various modifications and variations to the invention without departing from the spirit and scope of the invention. Thus the invention is also intended to encompass these modifications and variations therein as long as these modifications and variations come into the scope of the claims of the invention and their equivalents.

The invention claimed is:

1. An array substrate, comprising:
a base substrate; and
a plurality of pixel units on the base substrate, wherein at least one of the pixel units comprises a plurality of sub-pixels;
wherein at least one of the sub-pixels comprises:
an electroluminescent component;
a pixel circuit, comprising a drive transistor for driving the electroluminescent component to emit light, wherein the drive transistor is a low temperature poly-si thin film transistor; and
a photo detection circuit, comprising a detection switch transistor and a PIN-type photodiode, wherein the detection switch transistor is a metal oxide transistor;
wherein the pixel circuit further comprises: a data switch transistor and a compensation switch transistor;
a gate of the data switch transistor is coupled with a first scanning signal terminal, a first electrode of the data switch transistor is coupled with a data signal terminal, and a second electrode of the data switch transistor is coupled with a gate of the drive transistor;
a gate of the compensation switch transistor is coupled with a second scanning signal terminal, a first electrode of the compensation switch transistor is coupled with a preset signal terminal, and a second electrode of the compensation switch transistor is coupled with a first terminal of the electroluminescent component;
wherein the pixel circuit and the photo detection circuit are mutually independent.

2. The array substrate according to claim 1, wherein a first electrode of the drive transistor is coupled with a first power terminal, and a second electrode of the drive transistor is coupled with a first terminal of the electroluminescent component.

3. The array substrate according to claim 2, wherein the data switch transistor is a metal oxide transistor;

wherein the array substrate further comprises a first interlayer dielectric layer on the drive transistor, wherein the first interlayer dielectric layer covers the drive transistor;
wherein the data switch transistor is arranged at a side, facing away from the array substrate, of the first interlayer dielectric layer; the data switch transistor comprises a metal oxide semiconductor layer, a second gate insulation layer and a second gate; and an orthographic projection of the second gate insulation layer and the second gate on the base substrate covers an channel region of the metal oxide semiconductor layer.

4. The array substrate according to claim 2, wherein the compensation switch transistor is a metal oxide transistor;
wherein the compensation switch transistor is arranged at a side, facing away from the array substrate, of the first interlayer dielectric layer; the compensation switch transistor comprises a metal oxide semiconductor layer, a second gate insulation layer and a second gate; and an orthographic projection of the second gate insulation layer and the second gate on the base substrate covers an channel region of the metal oxide semiconductor layer.

5. The array substrate according to claim 2, wherein the drive transistor is a N-type transistor; and the pixel circuit further comprises: a storage capacitor;
the storage capacitor is coupled between the gate and the second electrode of the drive transistor.

6. The array substrate according to claim 5, wherein the data switch transistor and the compensation switch transistor are both N-type transistors.

7. The array substrate according to claim 2, wherein the drive transistor is a P-type transistor; and the pixel circuit further comprises: a storage capacitor;
the storage capacitor is coupled between the gate and the first electrode of the drive transistor.

8. The array substrate according to claim 7, wherein the data switch transistor and the compensation switch transistor are both P-type transistors.

9. An array substrate, comprising:
a base substrate; and
a plurality of pixel units on the base substrate, wherein at least one of the pixel units comprises a plurality of sub-pixels;
wherein at least one of the sub-pixels comprises:
an electroluminescent component;
a pixel circuit, comprising a drive transistor for driving the electroluminescent component to emit light, wherein the drive transistor is a low temperature poly-si thin film transistor; and
a photo detection circuit, comprising a detection switch transistor and a PIN-type photodiode, wherein the detection switch transistor is a metal oxide transistor;
wherein the photo detection circuit further comprises: a detection capacitor;
wherein a gate of the detection switch transistor is coupled with a third scanning signal terminal, a first electrode of the detection switch transistor is coupled with a second electrode of the PIN-type photodiode, and a second electrode of the detection switch transistor is coupled with an optical detection signal terminal;
a first electrode of the PIN-type photodiode is coupled with a reference voltage terminal;
the detection capacitor is coupled between the first electrode and the second electrode of the PIN-type photodiode;

wherein the array substrate further comprises a first interlayer dielectric layer on the drive transistor and the PIN-type photodiode, wherein the first interlayer dielectric layer covers the drive transistor and the PIN-type photodiode;
wherein the detection switch transistor is arranged at a side, facing away from the array substrate, of the first interlayer dielectric layer;
wherein the pixel circuit and the photo detection circuit are mutually independent.

10. The array substrate according to claim 1, wherein the transistor being metal oxide transistor is on a side, away from the base substrate, of the transistor being low temperature poly-si thin film transistor and the PIN-type photodiode.

11. A fabrication method of the array substrate according to claim 1, comprising:
providing a base substrate;
forming a pixel circuit and a photo detection circuit on the base substrate; and
forming an electroluminescent component on the base substrate on which the pixel circuit and the photo detection circuit are formed.

12. The fabrication method according to claim 11, wherein forming the pixel circuit and the photo detection circuit on the base substrate comprises:
forming a transistor being a low temperature poly-si thin film transistor and a PIN-type photodiode on the base substrate; and
forming a transistor being a metal oxide transistor on the base substrate on which the transistor being low temperature poly-si thin film transistors and the PIN photodiode are formed.

13. The fabrication method according to claim 12, wherein forming the transistor being the low temperature poly-si thin film transistor and the PIN-type photodiode on the base substrate comprises:
forming a first electrode on the base substrate;
forming a polysilicon layer on the base substrate, wherein the polysilicon layer is spaced from the first electrode;
forming a first amorphous silicon layer on the first electrode, wherein an orthographic projection of the first amorphous silicon layer on the base substrate overlaps with an orthographic projection of the first electrode on the base substrate;
performing ion doping on the polysilicon layer and the first amorphous silicon layer for first time;
forming a second amorphous silicon layer on the first amorphous silicon layer, wherein an orthographic projection of the second amorphous silicon layer on the base substrate overlaps with the orthographic projection of the first electrode on the base substrate;
forming a first gate insulation layer and a first gate sequentially on the polysilicon layer and exposing a source region and a drain region of the polysilicon layer, wherein an orthographic projection of the first gate insulation layer and the first gate on the base substrate covers a channel region of the polysilicon layer;
forming a third amorphous silicon layer on the second amorphous silicon layer, wherein an orthographic projection of the third amorphous silicon layer on the base substrate overlaps with the orthographic projection of the first electrode on the base substrate;
performing a second ion doping on the source region and the drain region of the polysilicon layer and the third amorphous silicon layer;

forming a second electrode on the third amorphous silicon layer, wherein an orthographic projection of the second electrode on the base substrate overlaps with the orthographic projection of the first electrode on the base substrate; and
forming a first interlayer dielectric layer on the base substrate on which the second electrode is formed.

14. The fabrication method according to claim 13, wherein forming the transistor being metal oxide transistor on the base substrate on which the transistor being low temperature poly-si thin film transistor and the PIN photodiode are formed comprises:
forming a metal oxide semiconductor layer, a second gate insulation layer and a second gate sequentially on the first interlayer dielectric layer and exposing a source region and a drain region of the metal oxide semiconductor layer, wherein an orthographic projection of the second gate insulation layer and the second gate on the base substrate covers the channel region of the metal oxide semiconductor layer;
forming a second interlayer dielectric layer on the base substrate on which the metal oxide semiconductor layer, the second gate insulation layer and the second gate are formed;
forming first via holes penetrating through the first interlayer dielectric layer and the second interlayer dielectric layer and second via holes penetrating through the second interlayer dielectric layer through etching; and
forming a plurality of first connection portions, second connection portions and third connection portions, which are spaced, on the second interlayer dielectric layer, so that the second electrode is electrically connected with the first connection portion through the first via hole, the source region and the drain region of the polysilicon layer are respectively electrically connected with the corresponding second connection portions through the first via holes, and the source region and the drain region of the metal oxide semiconductor layer are respectively electrically connected with the corresponding third connection portions through the second via holes, wherein one PIN-type photodiode corresponds to one first connection portion, one low temperature poly-si thin film transistor corresponds to two second connection portions, and one metal oxide transistor corresponds to two third connection portions.

15. An array substrate, comprising:
a base substrate; and
a plurality of pixel units on the base substrate, wherein at least one of the pixel units comprises a plurality of sub-pixels;
wherein at least one of the sub-pixels comprises:
an electroluminescent component;
a pixel circuit, comprising a drive transistor for driving the electroluminescent component to emit light, wherein the drive transistor is a low temperature poly-si thin film transistor;
wherein pixel circuit further comprises a compensation switch transistor; a gate of the compensation switch transistor is coupled with a second scanning signal terminal, a first electrode of the compensation switch transistor is coupled with a preset signal terminal, and a second electrode of the compensation switch transistor is coupled with a first terminal of the electroluminescent component; wherein the compensation switch transistor is a metal oxide transistor;
wherein the drive transistor comprises: a polysilicon layer, and a first gate insulation layer and a first gate on the polysilicon layer; wherein an orthographic projection of the first gate insulation layer and the first gate on the base substrate covers a channel region of the polysilicon layer; wherein a source region and a drain region of the polysilicon layer are respectively arranged on two sides of the channel region of the polysilicon layer;

wherein the array substrate further comprises a first interlayer dielectric layer on the drive transistor, wherein the first interlayer dielectric layer covers the drive transistor;

wherein the compensation switch transistor is arranged at a side, facing away from the array substrate, of the first interlayer dielectric layer; the compensation switch transistor comprises a metal oxide semiconductor layer, a second gate insulation layer and a second gate; and an orthographic projection of the second gate insulation layer and the second gate on the base substrate covers an channel region of the metal oxide semiconductor layer.

* * * * *